United States Patent [19]

Takeuchi et al.

[11] Patent Number: 4,856,034
[45] Date of Patent: Aug. 8, 1989

[54] SEMICONDUCTOR INTEGRATED CIRCUIT

[75] Inventors: Yoshiaki Takeuchi; Kaoru Nakagawa, both of Yokohama, Japan

[73] Assignee: Kabushiki Kaisha Toshiba, Kawasaki, Japan

[21] Appl. No.: 199,914

[22] Filed: May 27, 1988

[30] Foreign Application Priority Data

Jun. 3, 1987 [JP] Japan ................... 62-139405

[51] Int. Cl.⁴ ............ G11C 11/40; H03K 21/02
[52] U.S. Cl. ..................... 377/74; 377/73; 377/79
[58] Field of Search ............ 377/73, 74, 78, 79

[56] References Cited

U.S. PATENT DOCUMENTS

| | | | |
|---|---|---|---|
| 3,976,984 | 8/1976 | Hirasawa | 377/74 |
| 3,979,580 | 9/1976 | Crilly et al. | 377/73 |
| 3,992,635 | 11/1976 | Suzuki et al. | 377/74 |
| 4,057,741 | 11/1977 | Piguet | 377/79 |
| 4,390,960 | 6/1983 | Yamashita et al. | 377/73 |

Primary Examiner—John S. Heyman
Attorney, Agent, or Firm—Finnegan, Henderson, Farabow, Garrett and Dunner

[57] ABSTRACT

A semiconductor integrated circuit comprises a three-valued logic circuit connected to receive an output signal of a logic circuit to receive at one input a control clock signal and at the other input an input signal, and a flip-flop circuit composed of a clocked inverter to receive the output signal of the three-valued logic circuit, and another inverter.

7 Claims, 8 Drawing Sheets

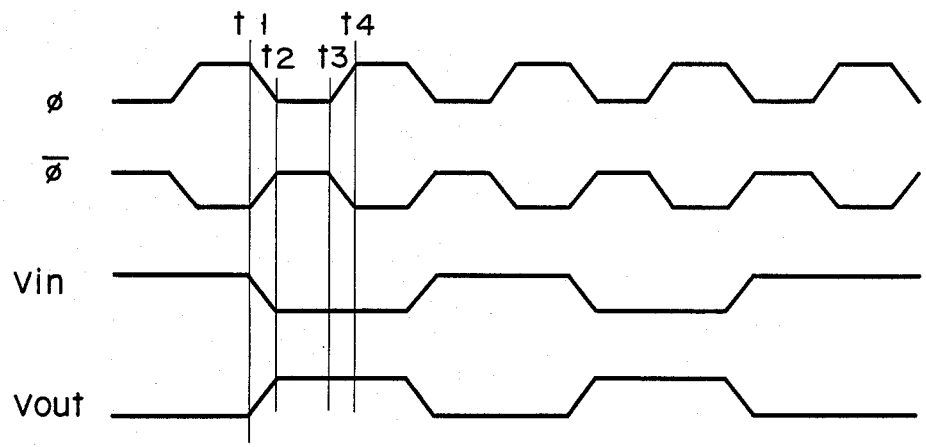
F I G. 2
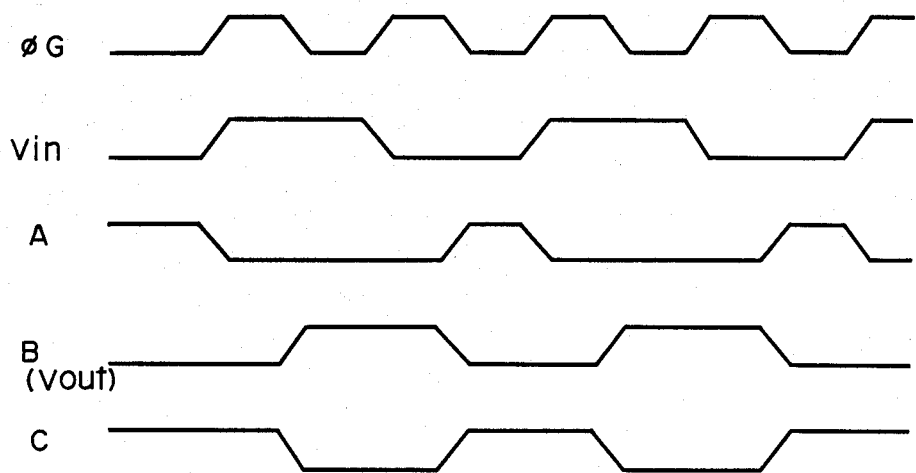
F I G. 4

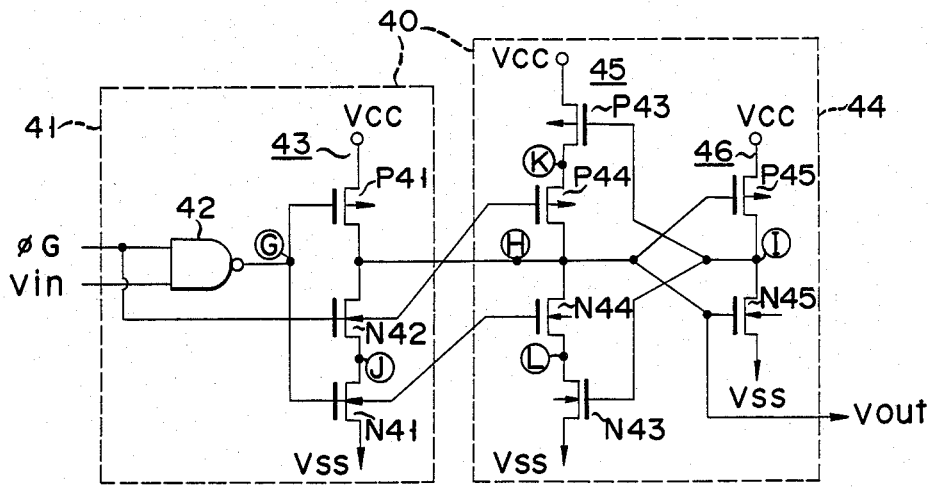
F I G. 5
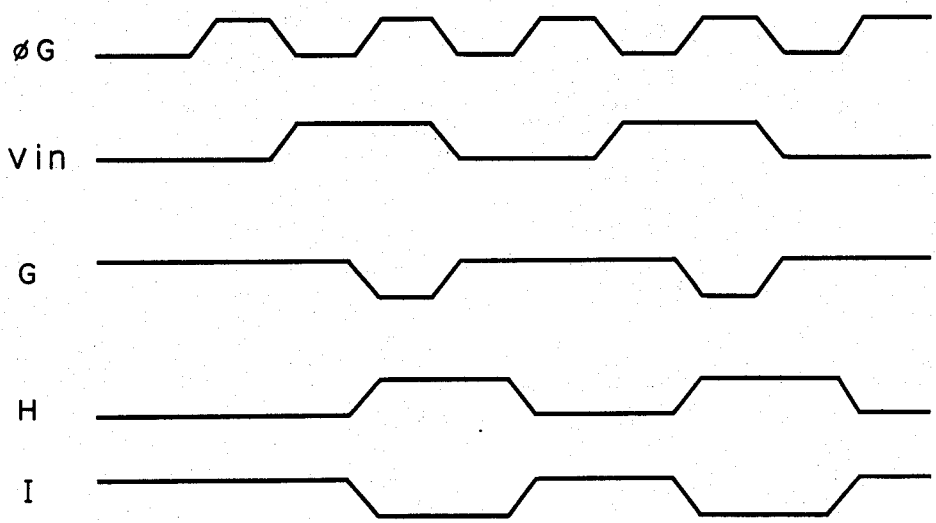
F I G. 6

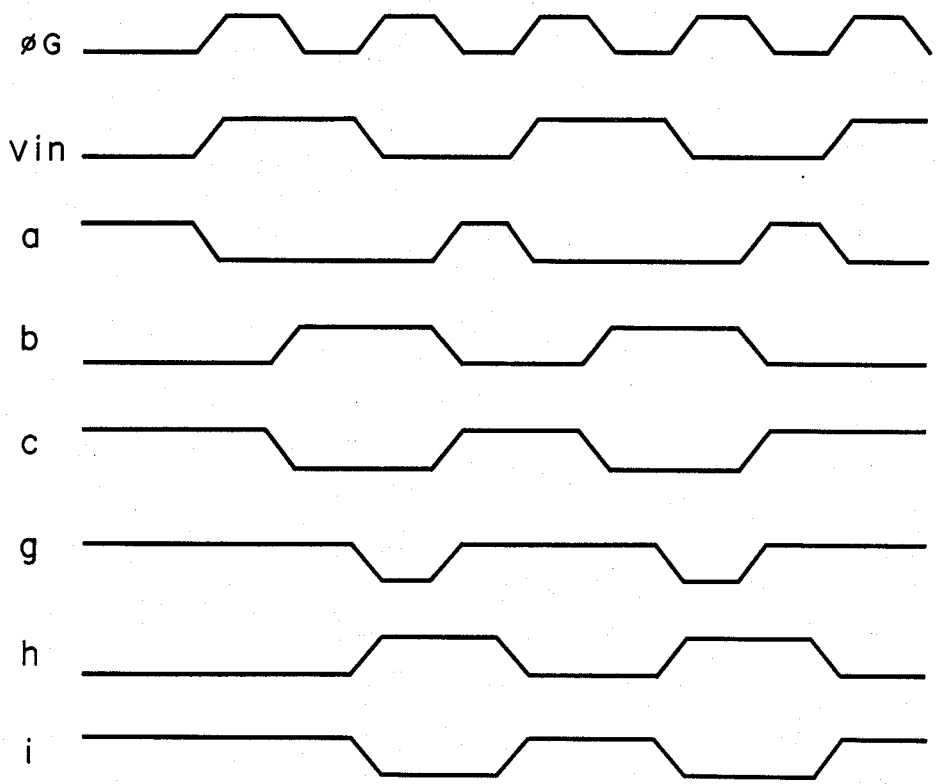
F I G. 8

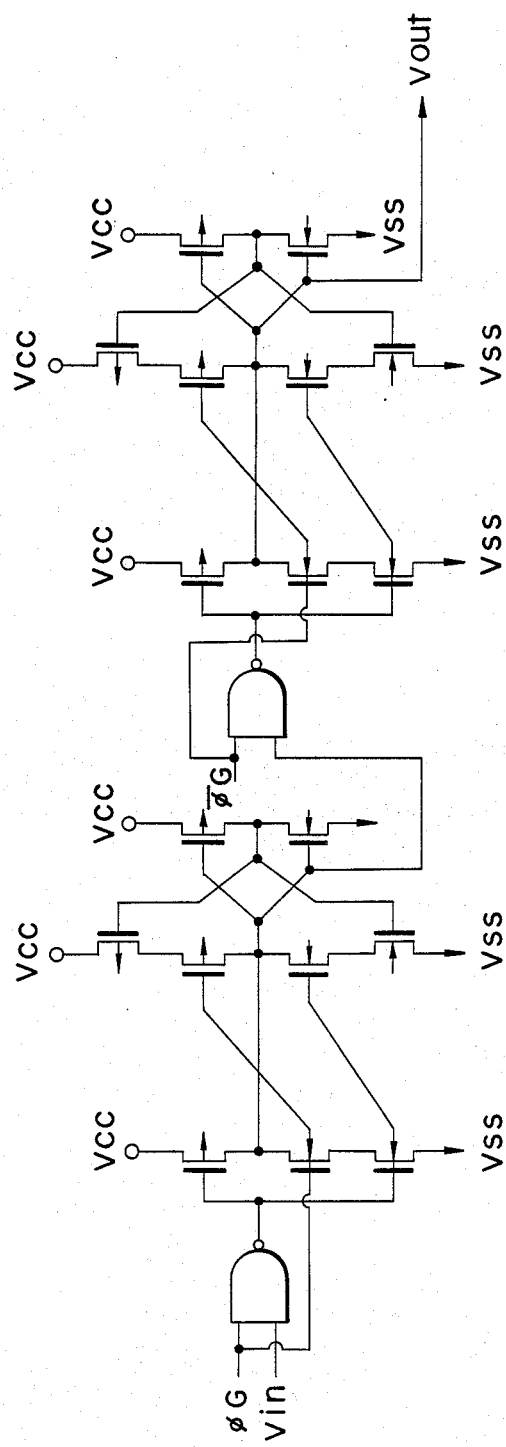
F I G. 10

SEMICONDUCTOR INTEGRATED CIRCUIT

BACKGROUND OF THE INVENTION

1. Field of the Invention

The present invention relates to a semiconductor integrated circuit, and more particularly, to a semiconductor integrated circuit used as a latch circuit or a shift register in the output stage of a memory.

2. Description of the Related Art

In recent years special-purpose memories have energetically been developed. In particular, large-capacity and low-cost DRAMs have the attention especially in the field of image processing in television or video.

Conventionally, where a DRAM is used for image storage, a parallel to serial conversion circuit adapted for reading and writing data had to be installed externally. Recently, however, a new type of DRAM has appeared which incorporates a shift register into a chip. With this type of DRAM data is read out of RAM in parallel to be transferred to the shift register, and data is then transferred from the shift register to the outside at high speed.

Since the operation speed of image memories is high (several tens of nanoseconds in cycle time), the high-speed operation capability and high reliability in operation are required of shift registers in the output stages of the memories.

FIG. 1 shows a prior art shift register.

This shift register combines a circuit 91 called a clocked inverter circuit and a flip-flop circuit 93 to form a latch circuit 90. The two latch circuits 90, 100 are connected in cascade. The preceding circuit 90 and succeeding circuit 100 are referred to as the master and slave, respectively. More specifically, clocked inverter circuit 91 comprises a CMOS inverter consisting of P-channel and N-channel MOS transistors P91 and N91 having their sources connected to a power supply voltage Vcc and a ground voltage Vss, respectively, and their gates connected together, and switching MOS transistors P92 and N92 connected between the gates of inverting transistors P91 and N91. Flip-flop circuit 93 consists of an inverter 95 and clocked inverter 94 as shown.

Further, switching transistors P92 and N92 of clocked inverter 91 in master section 90 have their gates connected to receive complementary clock pulses $\phi$ and $\bar\phi$, respectively, and switching transistors P94 and N94 of clocked inverter 94 in flip-flop circuit 93 have their gates connected to receive complementary clock pulses $\bar\phi$ and $\phi$, respectively.

On the other hand, the gates of switching transistors P102 and N102 of clocked inverter 101 in slave section 100 are connected to receive complementary clock pulses $\bar\phi$ and $\phi$, respectively, and the gates of switching transistors P104 and N104 of clocked inverter 104 in flip-flop circuit 103 are connected to receive complementary clock pulses $\phi$ and $\bar\phi$, respectively.

Hereinafter, the operation of the shift register configured by clocked inverters controlled by complementary clocks $\phi$ and $\bar\phi$ will be described with reference to FIG. 2.

As shown in FIG. 2, at a time when clock $\phi$ is low (0V) and clock $\bar\phi$ is high (5V), switching transistors P92 and N92 of clocked inverter 91 in master section 90 turn on together, so that the two CMOS inverters in the master section are operated to invert an input signal Vin, and a delayed output appears a node f. At this time switching transistors P94 and N94 in flip-flop circuit 93 turn off together. Switching transistors P102 and N102 in slave section 100 are off together so that the CMOS inverter therein is disabled. Switching transistors P104 and N104 in flip-flop circuit 103 are on together so that the previous state is held.

Next, at a time t2 when $\phi$ goes high, and $\bar\phi$ goes low, switching transistors P92 and N92 in master section 90 turn off together. At the same time switching transistors P94 and N94 in flip-flop circuit 93 turn on to continue to hold data so far stored. Further, in slave section 100 switching transistors P102 and N102 turn on together to transfer data on node f to an output terminal OUT.

At a time t3, namely, when $\phi$ remains high and $\bar\phi$ goes remains low, flip-flop circuit 93 in master section 90 keeps holding the stored data. Since switching transistors P92 and N92 in clocked inverter 91 are both off the output signal Vout will not change with a change in the input signal Vin.

Finally, at a time when $\phi$ goes low and $\bar\phi$ goes high, switching transistors P102 and N102 in the slave section 100 turn off together, and switching transistors P104 and N104 in flip-flop circuit 103 turn on together. As a result flip-flop circuit 103 is activated to hold data. This data is data which was stored in master section 90 at time t3, and not new data. Thus, no change will occur in the output signal Vout. Moreover, in master section 90 switching transistors P92 and N92 turn on together, and in flip-flop circuit 93 switching transistors P94 and N94 both turn off. Thus, a new input signal Vin may be entered.

With the shift register as described above, the output signal Vout takes, under the second transient condition of clocks $\phi$ and $\bar\phi$ as occurs at the time t2, a value of the input signal Vin and holds the value until the second condition occurs again.

To perform such an operation reliably, two clocks $\phi$ and $\bar\phi$ are needed which are always to be completely opposite in polarity as shown in FIG. 2. It is difficult to generate such clocks. To generate such clocks will result in complexity in circuit arrangements, leading to an increase in chip area. Even if completely opposite polarity clock signals are externally applied, internal circuits cannot directly be driven by such externally applied clock signals. It is necessary to produce, within a chip, a signal synchronized with an externally applied signal, and a separate signal opposite in polarity to the produced signal through an inverter. Further, actual clocks have propagation delays in their rise and fall because of the gate capacitance, wiring capacitance or wiring resistance of circuits to be driven. The propagation delay times will vary drastically with the above capacitance and resistance, and the power supply voltage Vcc.

Accordingly, in case where the propagation delay times of the clock waveforms become long, and the two clock waveforms have a difference in their timing, a high-impedance state unique to the clocked inverters may occur in a transient state from the input-data-outputting state to the output-data-holding state. As the case may be, the output data might be inverted, causing a malfunction.

The high-impedance state will be specifically described hereinafter. Suppose now that an input signal Vin at input IN is low, clock $\phi$ is low and clock $\bar\phi$ is high. Then, in clocked inverter 91, transistors P91, P92 and N92 are on, and transistor N91 is off so that node a is at a high level. In clocked inverter 94 of flip-flop circuit 93, on the other hand, transistors P94 and N94 are off so that the clocked inverter is disabled. Thus, the output level at node a is inverted by inverter 95 so that output node f is at a low level as is the case with input IN.

Suppose, next, that the input signal Vin at input IN remains low, and both clocks φ and φ go high temporally. Then transistors P91 and N92 turn on, and transistors P92 and N91 turn off in clocked inverter circuit 91, while transistors P93 and N94 turn on, and transistors P94 and N93 turn off in clocked inverter 94. Thus, clocked inverters 91 and 94 are both disabled with the result that output node a is in the high impedance state.

At this time, the potential at node a is initially at a high level as in the previous state. However, since transistors N92, N94 and N95 are on, node a will conduct to nodes c and e, thus dropping the potential at node a. If the voltage drop is large enough to turn transistor P95 and N93 on and turn transistor P93 and N95 off, then the data at node f will be undesirably inverted to the high level.

Next, suppose that a high-level input signal Vin is applied to input IN, clock φ is low and clock φ is high. In this case transistors P92, N92 and N91 are on, and transistor P91 is off in clocked inverter 91. As a result node a is at the low level. Since transistors P93, P94 and N94 are off, and transistor N93 is off, clocked inverter 94 in flip-flop circuit 93 is disabled. As a result node f goes to the high level, so that the data at input IN is output.

Consider, next, that the input signal Vin remains high, and both clocks φ and φ go low temporally. Then, transistors P92 and N91 are on, and transistors P91 and N92 are off in clocked inverter 91. In clocked inverter 94 of flip-flop circuit 93, transistors P94 and N93 are on and transistors P93 and N94 are off. Consequently, clocked inverters 91 and 94 are both disabled so that node a is in the high impedance state.

In this case, although the potential at node a is first held at the low level as in the previous state, the potential at node a will be raised if the potential at nodes b and d is at the high level, because transistors P92 and P94 are on. If the increase in potential at node a is large enough to turn transistors P93 and N95 on and turn transistors N93 and P95 off, then data at node f will be inverted.

With the prior art circuit, as described above, the output node of the clocked inverters would be brought to the high-impedance state by a change in the phase angle between opposite polarity clock signals φ and φ. This may lead to a malfunction. In particular, where high frequency clock signals are needed for high-speed operations, a change in the phases between complementary clock signals is liable to occur. Therefore where such a shift register as described above is provided on the output side of an image memory a problem may arise as to the reliability of operations.

SUMMARY OF THE INVENTION

It is an object of this invention to remove the drawbacks of the prior art circuit in which the output node of the clocked inverters would be brought to the high-impedance state by a change in the phase angle between opposite polarity clock signals, thereby leading to a malfunction due to high speed operations and to provide a semiconductor integrated circuit capable of achieving a highly reliable operation during high-speed operations.

A semiconductor integrated circuit according to this invention comprises a logic circuit having a first and a second input connected to receive a control clock signal and a input signal, respectively; first and second transistors of a first conductivity type connected in series between a first power supply terminal and a first node, the first transistor having a gate connected to receive an output signal of the logic circuit, and the second transistor having a gate connected to receive the control clock signal; a third transistor of a second conductivity type connected between the first node and a second power supply terminal, and having a gate connected to receive the output signal of the logic circuit; fourth and fifth transistors of the first conductivity type connected in series between the first power supply terminal and a second node connected to the first node, the fourth transistor having a gate connected to receive the output signal of the logic circuit, and the fifth transistor having a gate connected to a third node; sixth and seventh transistors of the second conductivity type connected in series between the second power supply terminal and the second node, the sixth transistor having a gate connected to receive the clock signal, and the seventh transistor having a gate connected to the third node; an eighth transistor of the first conductivity type connected between the third node and the first power supply terminal, and having a gate connected to the second node; and a ninth transistor of the second conductivity type connected between the third node and the second power supply terminal, and having a gate connected to the second node; an output signal of the semiconductor integrated circuit being taken from one of the second node and the third node.

In the semiconductor integrated circuit, the first and third nodes are always held either at a high level or at a low level, and never takes the high-impedance state. Thus, an erroneous change in potential of the output signal can be avoided, so that a stable output signal is obtained. Further, a single-phase clock signal suffices for data transfer control. Therefore, a highly reliable circuit operation can be obtained without providing a complex clock generator.

BRIEF DESCRIPTION OF THE DRAWINGS

FIG. 2 is a timing diagram used to explain the operation of the circuit of FIG. 1;

FIG. 4 is a timing diagram of the semiconductor integrated circuit of FIG. 3;

FIG. 5 is a circuit diagram of a semiconductor integrated circuit according to a second embodiment of this invention;

FIG. 6 is a timing diagram of the semiconductor integrated circuit of FIG. 5;

FIG. 8 is a timing diagram of the shift register of FIG. 7; and

FIGS. 9 and 10 show modifications of the shift register of FIG. 7.

DETAILED DESCRIPTION OF THE PREFERRED EMBODIMENTS

Figure 3:
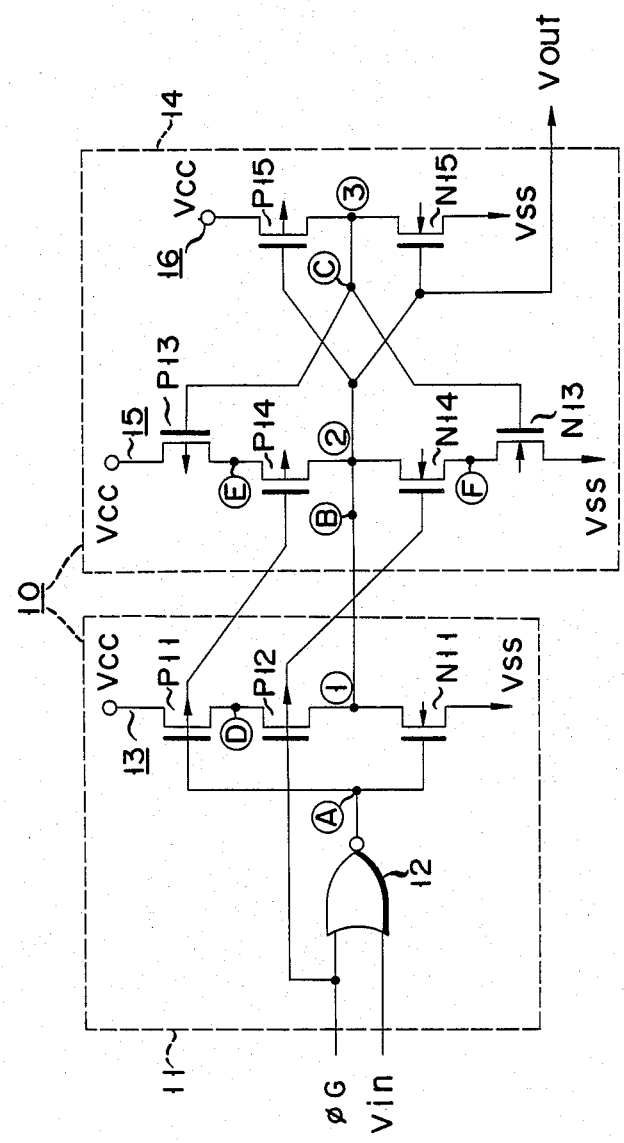
FIG. 3 is a circuit diagram of a semiconductor integrated circuit according to a first embodiment of this invention.

FIG. 3 shows a semiconductor integrated circuit according to an embodiment of this invention, i.e., a latch circuit which is arranged to control a latch operation by the use of a single clock signal and avoids the high-impedance state of a clocked inverter circuit.

This latch circuit controls a clocked inverter of a flip-flop circuit by gate outputs of what is called a three-valued logic circuit 11 in place of complementary clock signals $\phi$ and $\bar{\phi}$ in the prior art circuit. The logic circuit 11 comprises a NOR gate 12 receiving at an input a clock signal $\phi_G$ and at the other input an input signal Vin, P-channel MOS transistors P11 and P12 connected in series between a terminal for a power supply voltage Vcc and an output node, and an N-channel MOS transistor N11 connected between the output node and a terminal for a ground voltage Vss. Transistors P11 and N11 are supplied at their gates with an output signal of NOR gate 12, and transistor P12 is supplied at its gate with clock signal $\phi_G$. Flip-flop circuit 14 has the same arrangement as the prior art circuit of FIG. 1, except that, in clocked inverter 15, switching transistor P14 is supplied at its gate with the output signal of NOR gate 12, and switching transistor N14 is supplied at its gate with clock signal $\phi_G$.

The operation of the latch circuit as configured above will be described hereinafter.

Firstly, suppose that a low-level input signal Vin is applied to NOR gate 12 when clock $\phi_G$ is low. Then, output node A of NOR gate 12 goes to a high level, transistors P12 and N11 turn on, and transistor P11 turns off. As a result node B goes to a low level. Thus, in inverter 16 transistor P15 turns on and transistor N15 turns off, raising node C to the high level. Clocked inverter 15 is disabled because transistors P13, P14 and N14 are off, and transistor N13 is on.

Secondly, when clock $\phi_G$ goes high while input signal Vin remains low, output node A of NOR gate 12 goes to the low level, transistor P11 turns on, and transistors P12 and N11 turn off. Further, switching transistors P14 and N14 turn on so that clocked inverter 15 is enabled to hold data in the first state. This is because transistor P13 in clocked inverter 15 is off, and transistor N13 is on in the first state in which node C is at the high level, and node B goes to the low level when switching transistors P14 and N14 are turned on.

Thirdly, suppose that a high-level input signal Vin is applied to NOR gate 12 when clock $\phi_G$ is low. Then, output node A goes to the low level, transistors P11 and P12 turn on, and transistor N11 turn off. Thus node B goes to the high level. Consequently, transistors P15 and N15 of inverter 16 turn Off and on, respectively, causing node C to go to the low level. Node B remains in the high-level state because, in clocked inverter 15, transistors P13 and P14 turn on, and transistors N13 and N14 turn off.

Fourthly, when clock $\phi_G$ goes high while input signal Vin remains high, output node A of NOR gate 12 goes to the low level, transistors P11 turns on, and transistors P12 and N11 turn off. And, switching transistors P14 and N14 turn on so that clocked inverter 15 is enabled to hold data in the third state. This is because transistor P13 in clocked inverter 15 is on and transistor N13 is off in the third state in which node C is at the low level, and node B goes to the high level when switching transistors P14 and N14 are turned on. A timing diagram of the circuit of FIG. 3 is shown in FIG. 4.

As described above, the circuit of this embodiment is arranged such that the output node B is always either at a high level or at a low level and never takes the high-impedance state as in the prior art circuit. Thus, a very reliable circuit can be obtained in which the output is stable in potential. Further, since the circuit operation can be controlled by a single clock signal $\phi_G$ only, a highly reliable high-speed operation can be achieved without providing a complex circuit for generating clock signals.

Figure 1:
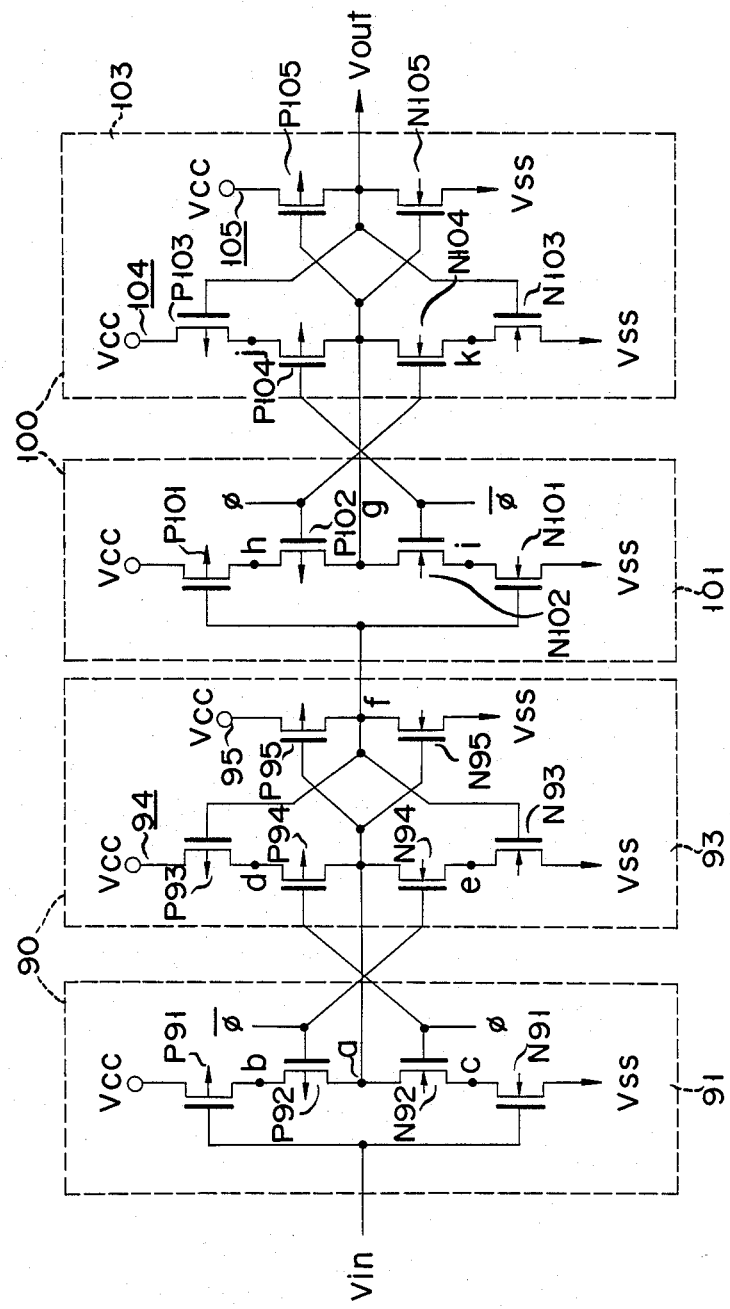
FIG. 1 is a circuit diagram of a prior art semiconductor integrated circuit.

FIG. 5 shows a latch circuit according to a second embodiment of this invention which is similar to that of FIG. 1. In this circuit a NAND gate 42 replaces NOR gate 12 in the first embodiment, and an N-channel transistor N42 replaces switching P-channel transistor P12. Transistor N42 is connected between the output node and ground terminal Vss. Further, clock signal $\phi_G$ is applied to the gate of switching transistor P44 of clocked inverter 45 in flip-flop circuit 44 as well as that of transistor N42, and the output of NAND gate 42 is applied to the gate of switching transistor N44 in clocked inverter 45 as well as those of transistors P41 and N41.

Next, the operation of the latch circuit of FIG. 5 will be described.

Firstly, suppose that a low-level input signal Vin is applied when clock $\phi_G$ is low. Then, output node G of NAND gate 42 goes to a high level. As a result, transistors N41 and N42 turn on, and transistor P41 turn off, causing node H to go to the high level. Thus, transistors P45 and N45 of inverter 46 turn on and off, respectively, causing node I to go to the high level. Further, in clocked inverter 45 transistors P43 and P44 turn off, and transistors N43 and N44 turn on, causing node H to go to a low level.

Secondly, when clock $\phi_G$ goes low while input signal Vin remains low, node G of NAND gate 42 is held at the high level. In this case transistors N41 and P41 remain on and off, respectively, and transistor N42 turns off. Switching transistor P44 remains on, and switching transistor N44 turns on, permitting clocked inverter 45 to hold data in the first state. This is because in the first state node I is at the high level so that transistors P43 and N43 are off and on, respectively, and when switching transistor N44 turns on with transistor P44 on, node H goes to the low level.

Thirdly, suppose that a high-level input signal Vin is applied when $\phi_G$ is high. Then, output node G of NAND gate 42 goes to the low level, transistors P41 and N42 turn on, and transistor N41 turn off, causing node H to go to the high level. As a result, transistors P45 and N45 of inverter 46 turn off and on, respectively, causing node I to go to the low level. At this time clocked inverter 45 is disabled, because transistor P43 turns on, and transistors P44, N43 and N44 turn off.

Fourthly, when $\phi_G$ goes low while input signal Vin remain high, output node G of NAND gate 42 goes to the high level, turning transistor N41 on and transistors P41 and N42 off. Because switching transistors P44 and N44 turn on, clocked inverter 45 is enabled to hold data in the third state. This is because in the third state node I is at the low level so that transistors P43 and N43 are on and off, respectively, and when switching transistors P44 and N44 turn on, node H goes to the high level.

As will be understood from the foregoing, the circuit of FIG. 5 is a latch circuit which responds to the falling edge of clock signal $\phi_G$ to hold the input signal Vin. In FIG. 6 a timing diagram is shown which represents a relationship among clock signal $\phi_G$, input signal Vin, and potentials at nodes G, H and I. This latch circuit can also provide high reliability in operation as in the circuit of FIG. 3, because node H never take the high-impedance state.

Figure 7:
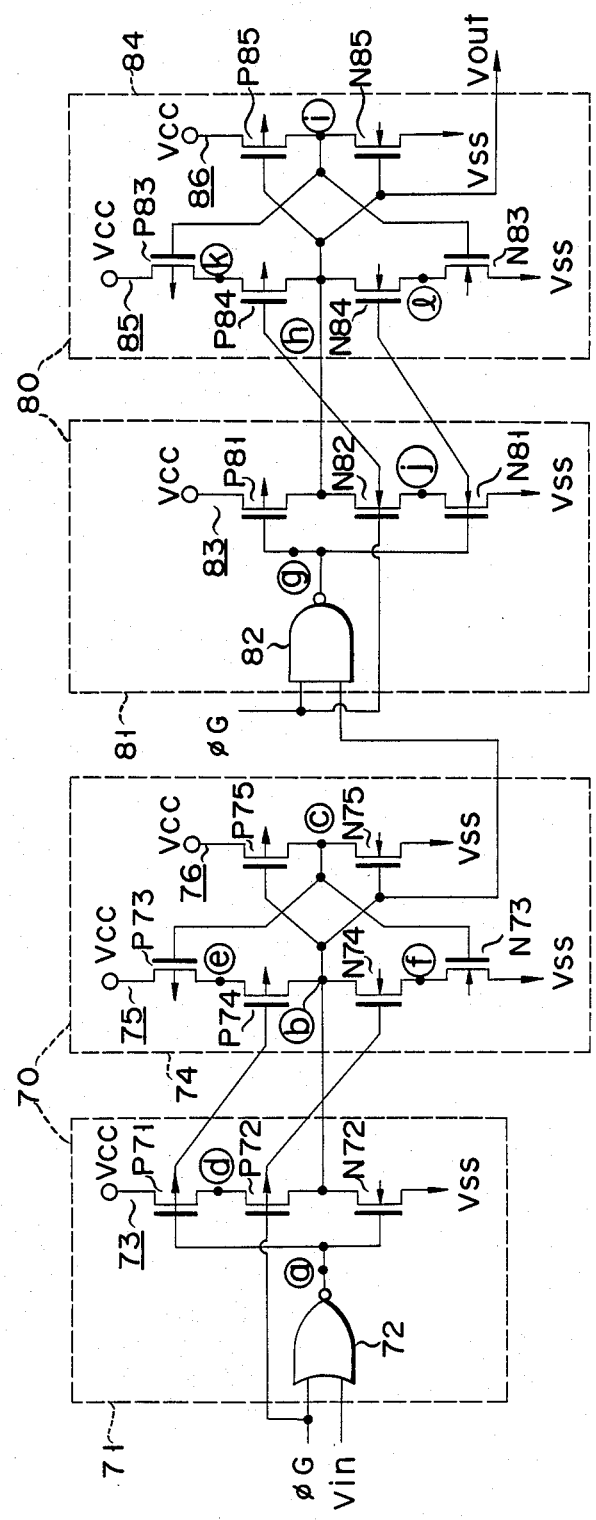
FIG. 7 shows a shift register constructed of the circuits of FIGS. 3 and 5.

FIG. 7 shows a one-bit shift register constructed by cascading the latch circuit of FIG. 3 and that of FIG. 5, and FIG. 8 shows a timing diagram thereof. In operation, the shift register reads input-signal data Vin on the falling edge of clock signal $\phi_G$ and transfers Vin to node b of master latch circuit 70. At this time slave latch circuit 80 holds data in the previous state. Next, when clock signal $\phi_G$ goes high, data in latch circuit 70 is read into latch circuit 80 so that the data appears at node h thereof. At this time master latch circuit 70 holds the data in the previous state. The above operations are repeatedly performed so that input data are transferred in sequence. With the shift register of FIG. 7, since data transfer can be performed by a single-phase clock signal, the pattern area necessary for the clock-generating circuit on a chip can considerably be reduced.

Figure 9:
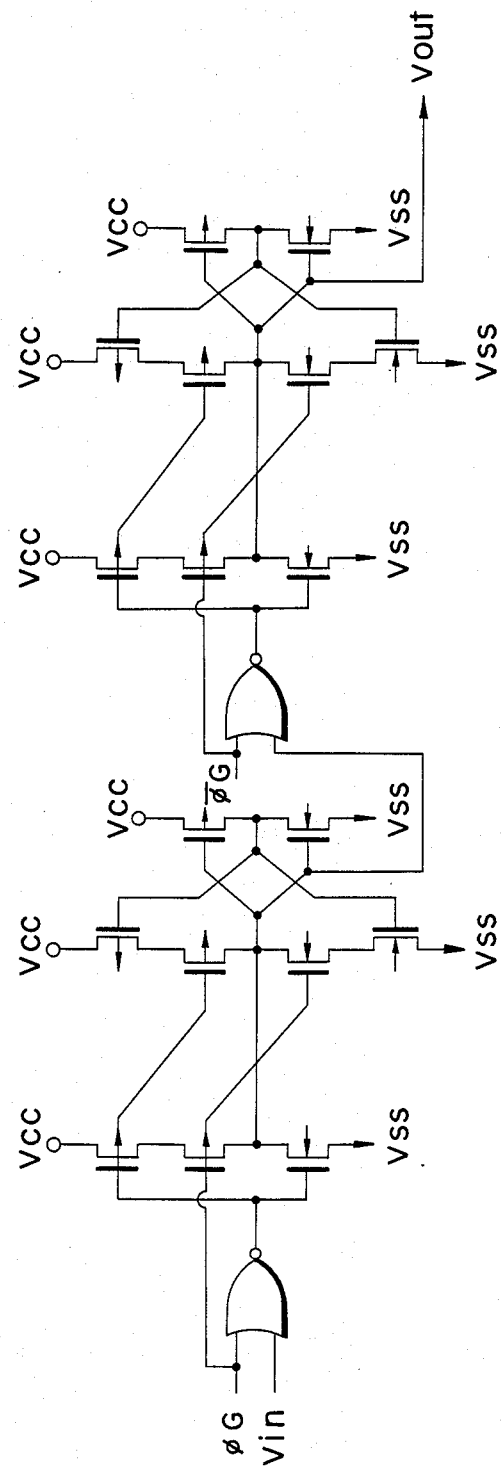

Modifications of this invention are possible in various ways. That is, as shown in FIG. 9, a shift register can be constructed by using the latch circuit of FIG. 3 alone. Similarly, the latch circuit of FIG. 5 alone can be used to form a shift register as shown in FIG. 10. In these cases, out-of-phase clock signals, e.g., opposite-polarity clock signals are needed for the master and the slave section. However, as describe above, since the output node in each latch circuit cannot take the high-impedance state, a highly reliable operation will result.

In the embodiments the switching transistors are all provided on the side of output node. Alternatively, these transistors may be provided on the sides of power supply terminals. For example, although, in FIG. 3, switching transistors P14 and N14 are connected between inverting transistors P13 and N13, the inverting transistors may be provided between the switching transistors.

As described above, this invention can provide a semiconductor integrated circuit which is simple in construction, and is highly reliable even in high-speed operation, because the output node of the clocked inverter can be prevented from taking the high-impedance state, and data transfer can be performed by a single-phase clock signal.

What is claimed is:

1. A semiconductor integrated circuit comprising:
   a logic circuit having a first and a second input connected to receive a control clock signal and an input signal, respectively;
   first and second transistors of a first conductivity type connected in series between a first power supply terminal and a first node, said first transistor having a gate connected to receive an output signal of said logic circuit, and said second transistor having a gate connected to receive the control clock signal;
   a third transistor of a second conductivity type connected between said first node and a second power supply terminal and having a gate connected to receive the output signal of said logic circuit;
   fourth and fifth transistors of the first conductivity type connected in series between said first power supply terminal and a second node connected to said first node, said fourth transistor having a gate connected to receive the output signal of said logic circuit, and said fifth transistor having a gate connected to a third node;
   sixth and seventh transistors of the second conductivity type connected in series between said second power supply terminal and said second node, said sixth transistor having a gate connected to receive the clock signal, and said seventh transistor having a gate connected to said third node;
   an eighth transistor of the first conductivity type connected between said third node and said first power supply terminal and having a gate connected to said second node; and
   a ninth transistor of the second conductivity type connected between said third node and said second power supply terminal, and having a gate connected to said second node;
   an output signal of said semiconductor integrated circuit being taken from at least one of said second node and said third node.

2. A semiconductor integrated circuit according to claim 1, wherein said logic circuit is a NOR gate.

3. A semiconductor integrated circuit according to claim 1, wherein said logic circuit is a NAND gate.

4. A semiconductor circuit comprising a first and a second latch circuit, wherein
   said first latch circuit comprises:
   a NOR gate having a first and a second input connected to receive a control clock signal and an input signal, respectively;
   first and second transistors of a first conductivity type connected in series between a first power supply terminal and a first node, said first transistor having a gate connected to receive an output signal of said NOR gate, and said second transistor having a gate connected to receive the control clock signal;
   a third transistor of a second conductivity type connected between said first node and a second power supply terminal and having a gate connected to receive the output signal of said NOR gate;
   fourth and fifth transistors of the first conductivity type connected in series between said first power supply terminal and a second node connected to said first node, said fourth transistor having a gate connected to receive the output signal of said NOR gate, and said fifth transistor having a gate connected to a third node;
   sixth and seventh transistors of the second conductivity type connected in series between said second power supply terminal and said second node, said sixth transistor having a gate connected to receive the clock signal, and said seventh transistor having a gate connected to said third node;
   an eighth transistor of the first conductivity type connected between said third node and said first power supply terminal, and having a gate connected to said second node; and
   a ninth transistor of the second conductivity type connected between said third node and said second power supply terminal, and having a gate connected to said second node, an output signal of said first latch circuit being taken from one of said second node and said third node; and
   said second latch circuit comprises:
   a NAND gate having a first and a second input connected to receive a control clock signal and an input signal, respectively;
   first and second transistors of the second conductivity type connected in series between a second power supply terminal and a first node, said first transistor having a gate connected to receive an output signal of said NAND gate, and said second transistor having a gate connected to receive the control clock signal;

a third transistor of the first conductivity type connected between said first node and a first power supply terminal, and having a gate connected to receive the output signal of said NAND gate;

fourth and fifth transistors of the second conductivity type connected in series between said second power supply terminal and a second node connected to said first node, said fourth transistor having a gate connected to receive the output signal of said NAND gate, and said fifth transistor having a gate connected to a third node;

sixth and seventh transistors of the first conductivity type connected in series between said first power supply terminal and said second node, said sixth transistor having a gate connected to receive the clock signal, and said seventh transistor having a gate connected to said third node;

an eighth transistor of the first conductivity type connected between said third node and said first power supply terminal, and having a gate connected to said second node; and a ninth transistor of the second conductivity type connected between said third node and said second power supply terminal, and having a gate connected to said second node, an output signal of said second latch circuit being taken from one of said second node and said third node;

said first and second latch circuits being cascaded to form a one-bit shift register such that the output signal of one of said first and second latch circuits is used as the input signal of the other, and as many one-bit shift registers of this type as desired being cascaded, and the same clock signal with a constant repetition rate being applied to said NOR gate and said NAND gate to shift the input signal.

5. A semiconductor integrated circuit comprising an even number of latch circuits cascaded to form a shift register, each of said latch circuits including:

a logic circuit having a first and a second input connected to receive a control clock signal and an input signal, respectively;

first and second transistors of a first conductivity type connected in series between a first power supply terminal and a first node, said first transistor having a gate connected to receive an output signal of said logic circuit, and said second transistor having a gate connected to receive the control clock signal;

a third transistor of a second conductivity type connected between said first node and a second power supply terminal, and having a gate connected to receive the output signal of said logic circuit;

fourth and fifth transistors of the first conductivity type connected in series between said first power supply terminal and a second node connected to said first node, said fourth transistor having a gate connected to receive the output signal of said logic circuit, and said fifth transistor having a gate connected to a third node;

sixth and seventh transistors of the second conductivity type connected in series between said second power supply terminal and said second node, said sixth transistor having a gate connected to receive the clock signal, and said seventh transistor having a gate connected to said third node;

an eighth transistor of the first conductivity type connected between said third node and said first power supply terminal and having a gate connected to said second node; and a ninth transistor of the second conductivity type connected between said third node and said second power supply terminal, and having a gate connected to said second node;

an output signal of said semiconductor integrated circuit being taken from one of said second node and said third node; and said logic circuit of each of even latch circuits being supplied with a first clock signal with a constant repetition rate, said logic circuit of each of odd latch circuits being supplied with a second clock signal having a predetermined phase difference with respect to the first clock signal, and the input signal being shifted by the first and second clock signals.

6. A semiconductor integrated circuit according to claim 5, wherein said logic circuit is a NOR gate.

7. A semiconductor integrated circuit according to claim 5, wherein said logic circuit is a NAND gate.

* * * * *